United States Patent
Zhao

(10) Patent No.: US 12,148,499 B1
(45) Date of Patent: Nov. 19, 2024

(54) TEST SYSTEM FOR DYNAMIC RANDOM ACCESS MEMORY MODULE OF AMD SYSTEM

(71) Applicants: SQ TECHNOLOGY (SHANGHAI) CORPORATION, Shanghai (CN); INVENTEC CORPORATION, Taipei (TW)

(72) Inventor: Wei-Guo Zhao, Shanghai (CN)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 18/211,529

(22) Filed: Jun. 19, 2023

(51) Int. Cl.
*G11C 29/56* (2006.01)

(52) U.S. Cl.
CPC ...... *G11C 29/56* (2013.01); *G11C 2029/5602* (2013.01)

(58) Field of Classification Search
None
See application file for complete search history.

(56) References Cited

U.S. PATENT DOCUMENTS

| | | | |
|---|---|---|---|
| 7,562,271 B2* | 7/2009 | Shaeffer | G06F 13/4027 714/724 |
| 2008/0080261 A1* | 4/2008 | Shaeffer | H01L 25/105 365/189.05 |
| 2014/0192583 A1* | 7/2014 | Rajan | G11C 7/10 365/63 |
| 2019/0052539 A1* | 2/2019 | Pappu | H04L 43/50 |

FOREIGN PATENT DOCUMENTS

| CN | 107766186 A | * | 3/2018 | .......... G06F 11/2221 |
| CN | 114490216 A | * | 5/2022 | |

OTHER PUBLICATIONS

PCA9546A, NXP Semiconductors, Rev. 6, pp. 1-30 (Year: 2014).*

* cited by examiner

*Primary Examiner* — Guerrier Merant

(57) ABSTRACT

A test system for a DRAM module of an AMD system is configured to verify information write and read functions of an EEPROM included in the DRAM module. The test system includes at least one memory module slot and a processing unit. The at least one memory module slot is configured for insertion of the DRAM module. The DRAM module includes the EEPROM. After an operating system controlling the processing unit, an I²C operation register of the processing unit can access the DRAM module through an I²C bus, and can write test data to and read the test data from the EEPROM. When the test data does not have sample data, it can be replaced by serial presence detection information.

4 Claims, 3 Drawing Sheets

TEST SYSTEM FOR DYNAMIC RANDOM ACCESS MEMORY MODULE OF AMD SYSTEM

CROSS-REFERENCE TO RELATED DISCLOSURES

This application claims priority to Chinese patent application No. 202310558326.5 filed with the Chinese Patent Office on May 17, 2023, entitled "TEST SYSTEM FOR DYNAMIC RANDOM ACCESS MEMORY MODULE OF AMD SYSTEM", the entire contents of which are incorporated by reference.

TECHNICAL FIELD

The present disclosure relates to the technical field of a test system for a Dynamic Random Access Memory module of an AMD system, and in particular, to a test system configured to verify information read and write functions of an electronically-erasable programmable read-only memory included in the DRAM.

BACKGROUND

Generally speaking, server or computer manufacturers typically only perform a stress test for reading and writing of the memory during production, i.e., testing the stability of the memory and testing the ability of the memory to store and retrieve data, but serial presence detection (SPD) information burned in the Electronically-Erasable Programmable Read-Only Memory (EEPROM) in the memory is not tested. However, the SPD information usually includes some important related information about the memory module, such as the type of memory particle, serial number, capacity, speed, required voltage, manufacturer, etc. If the SPD information is detected to obtain the related information contained therein, the access timing of the memory module can be set to the optimal state when using the memory, which can ensure a normal and stable operation of the system.

Referring to Patent application No. CN201010186093.3, in order to avoid problems such as conflict caused by duplicated communication address due to multiple blade-type systems sharing the same Inter-Integrated Circuit ($I^2C$) bus, a method of automatically assigning different $I^2C$ communication addresses to the EEPROMs in an electronic device is adopted to solve these problems.

SUMMARY

The present disclosure provides a test system for a Dynamic Random Access Memory (DRAM) module of an AMD system, and the verification of the information read and write functions of the EEPROM can be performed in two ways.

The present disclosure provides a test system for a DRAM module of an AMD system, configured to verify the information write and read functions of an EEPROM included in the DRAM module. The test system includes at least one memory module slot and a processing unit.

The at least one memory module slot is configured for insertion of at least one DRAM module. The at least one DRAM module includes the EEPROM.

The processing unit includes an $I^2C$ operation register. The $I^2C$ operation register is electrically coupled to the at least one memory module slot through at least one $I^2C$ bus.

The $I^2C$ operation register of the processing unit can accesses the at least one DRAM module through the $I^2C$ bus, and writes test data to and reads the test data from the EEPROM.

In the test system as described above, the information includes SPD information and temperature sensing (Temperature Sensor on DIMMs, TSOD) information. The memory controller can access the DRAM module through the $I^2C$ bus by reading the $I^2C$ slave address of the DRAM module, so as to access and read the SPD information and temperature sensing information.

In addition, in the test system as described above, the processing unit is an AMD central processing unit (CPU).

In addition, when the test system as described above is in operation, the AMD central processing unit is controlled through the operating system.

The test system as described above further includes a PCA9546A chip. The PCA9546A chip includes a plurality of mapping addresses, and the plurality of mapping addresses further includes at least one mapping address corresponding to the at least one DRAM module. When accessing the mapping address corresponding to the at least one DRAM module in the PCA9546A chip, the $I^2C$ operation register in the processing unit accesses all the DRAM modules through the $I^2C$ bus, and then access a specific DRAM module out of the DRAM modules through the access address corresponding to the specific DRAM module.

In the test system as described above, the test data may be one of sample data and SPD information. When there is no original sample data in the test system, in addition to writing sample data into the EEPROM and then read it out, it is also possible to write SPD information first instead. The EEPROM of the DRAM module is also accessed through the $I^2C$ slave address, and then the previously written SPD information in the EEPROM of the DRAM module is read through the $I^2C$ bus.

In addition, due to the limited writing and reading times of the EEPROM 40, the test data in the test system 1 is verified by a small amount of writing and reading, which can reduce the time required for each verification.

The present disclosure also provides a test system for a DRAM module of an AMD system, configured to verify the information write and read functions of an EEPROM included in the DRAM module. The test system includes at least one memory module slot and a baseboard management controller (BMC).

The at least one memory module slot is configured for insertion of the DRAM module. The DRAM module includes the EERPOM.

The BMC is electrically coupled to the at least one memory module slot through an $I^2C$ bus.

The BMC accesses the DRAM module through the $I^2C$ bus, and writes the test data in and reads the test data from the EEPROM.

The test system as described above further includes a PCA9546A chip. The PCA9546A chip includes a plurality of mapping addresses, and the plurality of mapping addresses includes at least one mapping address corresponding to the at least one DRAM module. When accessing the mapping address corresponding to the at least one DRAM module in the PCA9546A chip, the BMC accesses all the DRAM modules through the $I^2C$ bus, and then access a specific DRAM module out of the DRAM modules through the access address corresponding to the specific DRAM module.

Therefore, the test system for the DRAM module of the AMD system provided by the present disclosure can access the DRAM module via the I²C bus through the processing unit with a central processing unit or the BMC, and can write the test data to and read the test data from the EEPROM. When the test data does not have sample data, the verification can be performed by writing the sample data or SPD information first and then read it out.

The specific embodiments used in the present disclosure will be further described by the following embodiments and drawings.

DETAILED DESCRIPTION OF THE EMBODIMENTS

The inventors have found that when working with the AMD system, the SPD information is not tested. When users use the AMD system, although the AMD system may seem cost-effective initially, they will find various shortcomings such as poor stability, rapid declining efficiency, etc., after long-term use.

An object of the present disclosure is to provide a test system for a DRAM module of an AMD system, configured to verify information write and read functions of an EERPOM included in the DRAM module. A first embodiment and a second embodiment are provided. According to the JEDEC Solid State Technology Association specification, an EEPROM includes 512 bytes distributed in two storage pages. Each storage page includes 256 bytes. Each storage page includes two quadrants, and each quadrant includes 128 bytes. Therefore, the EEPROM contains a total of 512 bytes.

Figure 1:
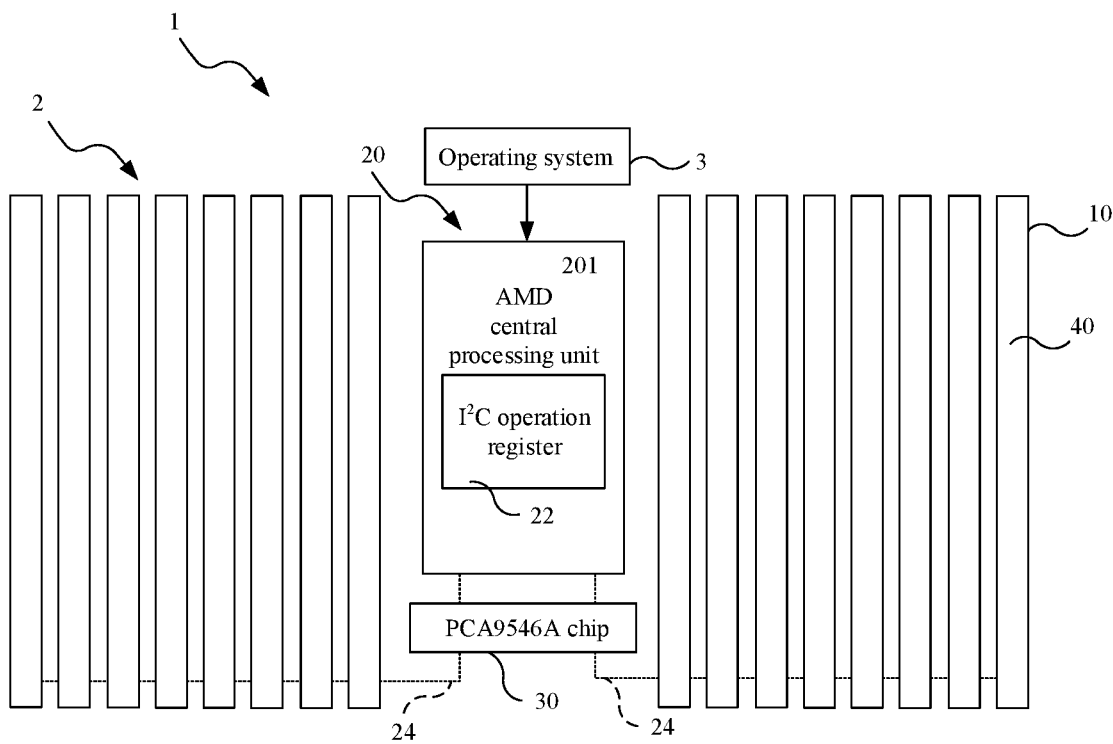
FIG. 1 shows a functional correlation diagram of a test system according to an embodiment of the present disclosure where a processing unit is a central processing unit.

FIG. 1 is a functional correlation diagram of a test system 1 of a first embodiment of the present disclosure where a processing unit 20 is a central processing unit. In the first embodiment, the test system 1 includes sixteen memory module slots 2 and a processing unit 20 which is an AMD central processing unit 201.

It should be understood that in other embodiments, the number of the memory module slots can be set according to actual needs. The number of the memory module slots is not limited in the present disclosure.

The memory module slots 2 are configured for insertion of DRAM modules 10. Therefore, sixteen DRAM modules 10 can be inserted into the sixteen memory module slots 2, respectively. Each DRAM module 10 includes an EEPROM 40. SPD information can be written into the EEPROMs 40, and therefore the EEPROMs 40 are those in which the information write and read functions are to be tested.

The processing unit 20 includes an I²C operation register 22. The I²C operation register 22 is electrically coupled to each memory module slot 2 through I²C buses 24. As shown in FIG. 1, there is an I²C bus 24 on the left and right, respectively. The I²C operation register 22 is electrically coupled to the left and right sixteen memory module slots 2 through the two I²C buses 24, respectively.

The I²C operation register 22 of the processing unit 20 can access the DRAM modules 10 inserted in the memory module slots 2 through the I²C buses 24 and can write and read test data in the EEPROMs 40 of the DRAM modules 10.

In the test system 1 described above, the information includes the SPD information and temperature sensing information. A memory controller (not shown in the figures) can access the DRAM modules 10 through the I²C buses 24 by reading the I²C slave address corresponding to the DRAM modules 10, so as to access and read the SPD information and temperature sensing information.

The memory module slots 2 of the test system 1 described above are suitable for computer devices with complex structures and reusable component contents. More expandable space can be reserved by the memory module slots 2 of the present disclosure. When the I²C operation register 22 accesses the DRAM modules 10 through the I²C buses 24, test data such as sample data or SPD information can be written and stored into the EEPROMs 40 of the DRAM modules 10 as contents for subsequent accesses.

As a supplementary note, when the test system 1 as described above is in operation, it first controls the processing unit 20 to start working through an operating system 3. The processing unit 20 of the test system 1 is an AMD central processing unit 201, which has the advantages of high-performance computing capability and can enhance the efficiency of the processor, and the manufacturing and assembling cost of servers or laptops can be greatly reduced due to the increased yield rate of the AMD central processing units 201. In brief, at the beginning, the test system 1 will control the AMD central processing unit to start working through the operating system 3.

In addition, the test system 1 as described above further includes a PCA9546A chip 30. The PCA9546A chip 30 has a plurality of mapping addresses. The plurality of mapping addresses includes at least one mapping address corresponding to the DRAM module 10. After accessing the mapping address corresponding to the DRAM module 10 in the PCA9546A chip 30 and accessing all the DRAM modules 10 through the I²C buses 24, the I²C operation register 22 of the processing unit 20 accesses specific DRAM modules 10 out of all the DRAM modules 10, respectively, through the access addresses corresponding to the specific DRAM modules 10. In other words, the PCA9546A chip 30 includes at least one mapping address corresponding to the DRAM module 10. Through the PCA9546A chip 30, the I²C operation register 22 accesses all the DRAM modules 10 through the I²C buses 24 and can access the specific DRAM modules 10 out of all the DRAM modules 10 through the access addresses corresponding to the specific DRAM modules 10.

In the test system 1 described above, the test data may be sample data or SPD information. When there is no original sample data in the test system 1, in addition to writing sample data into the EEPROM 40 and then reading it out, it is also possible to write the SPD information first instead. Similarly, the process is to access the EEPROM 40 of the DRAM module 10 through the I²C slave address, and then read the previously written SPD information from the EEPROM 40 of the DRAM module 10 through the I²C buses 24 to test the write and read functions.

In addition, due to the limited write and read times of the EEPROM 40, in the test system 1, the test data is verified by a small amount of writing and reading, which can reduce the time and energy required for each verification. In other words, the information read and write functions of the EEPROM are verified by writing the test data to a portion of the multiple bytes and then reading it out. For example, only 3 bytes of sample data are written into each quadrant of 128 bytes in the EEPROM as a test for writing and reading, which can effectively save test time and adapt to the hardware limitations of the EEPROM.

Figure 2:
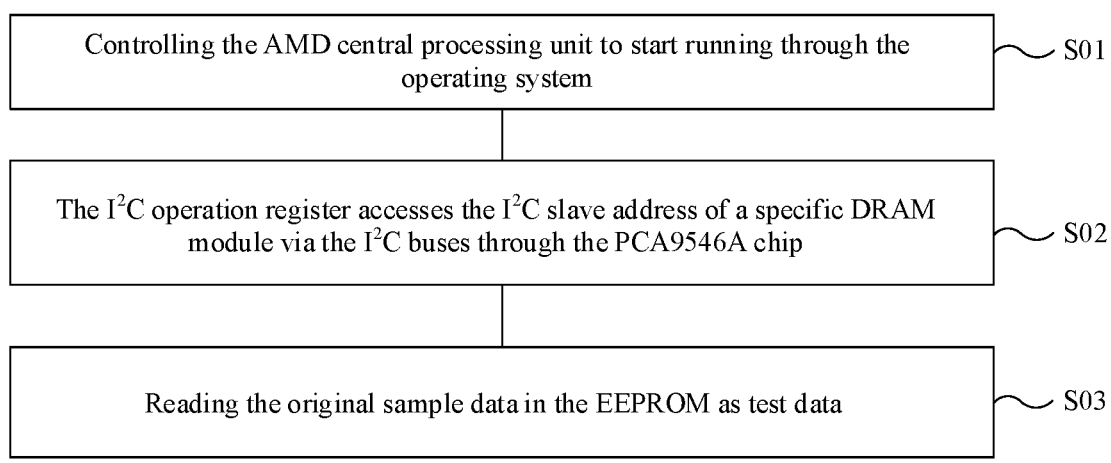
FIG. 2 is a flowchart of a method that a test system detects sample data through a processing unit according to an embodiment of the present disclosure.
Figure 3:
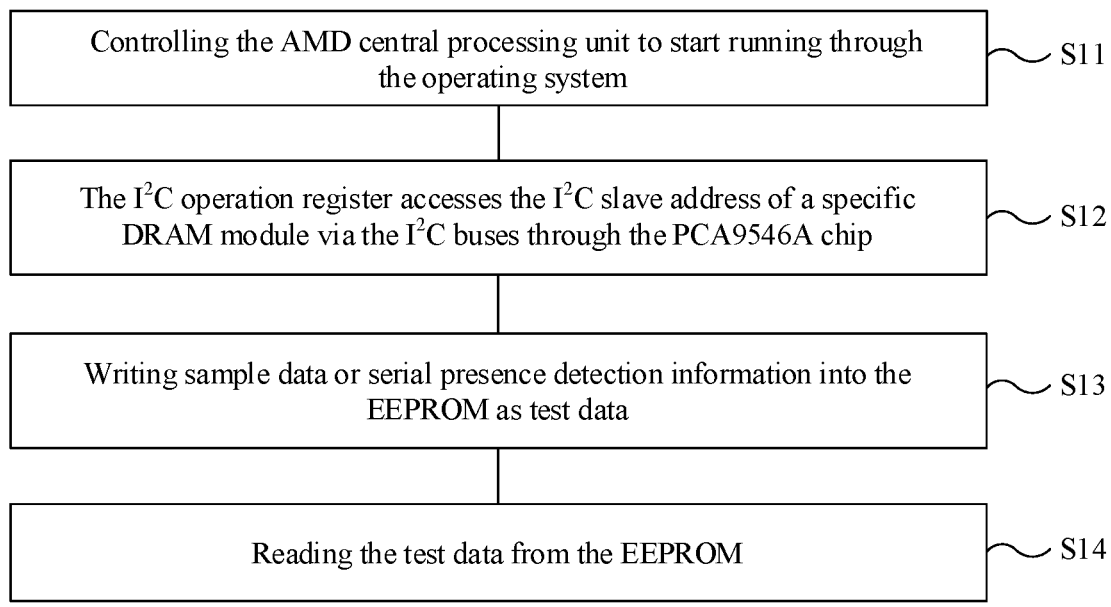
FIG. 3 is a flowchart of a method that a test system detects SPD information through a processing unit according to an embodiment of the present disclosure.

FIG. 2 is a flowchart showing a method that the test system 1 of the present disclosure detects the sample data using the processing unit 20, and FIG. 3 is a flowchart showing a method that the test system 1 of the present disclosure detects the SPD information using the processing unit 20. In the aforementioned first embodiment, the detection method can be further illustrated using the detection method of a horsea model. The detection method includes two cases: one is the state where there is original sample data, and the other is the state where there is no original sample data such that sample data or SPD information is read and written.

FIG. 2 is a method for the state where there is original sample data, and the method includes the following steps.

At step S01, the test system 1 controls the AMD central processing unit 201 to start running through the operating system 3.

At step S02, the I²C operation register 22 of the AMD central processing unit 201 is communicatively connected to the memory module slots 2 via the I²C buses 24 through the PCA9546A chip 30, and accesses the I²C slave address corresponding to a specific DRAM module 10 according to the mapping address corresponding to the DRAM module 10 in the PCA9546A chip 30, so as to access the specific DRAM module 10.

At step S03, the original sample data in the EEPROM 40 of the DRAM module 10 is read from the EEPROM 40 as test data.

In FIG. 3, a method for detecting sample data or SPD information includes the following steps.

At step S11, the test system 1 controls the AMD central processing unit 201 to start running through the operating system 3.

At step S12, the I²C operation register 22 of the AMD central processing unit 201 is communicatively connected to the memory module slots 2 via the I²C buses 24 through the PCA9546A chip 30, and accesses the I²C slave address corresponding to a specific DRAM module 10 according to the mapping address corresponding to the DRAM module 10 in the PCA9546A chip 30, so as to access the specific DRAM module 10.

At step S13, sample data or SPD information is written into the EEPROM 40 of the DRAM module 10 as test data.

At step S14, the test data is read from the EEPROM 40.

Figure 4:
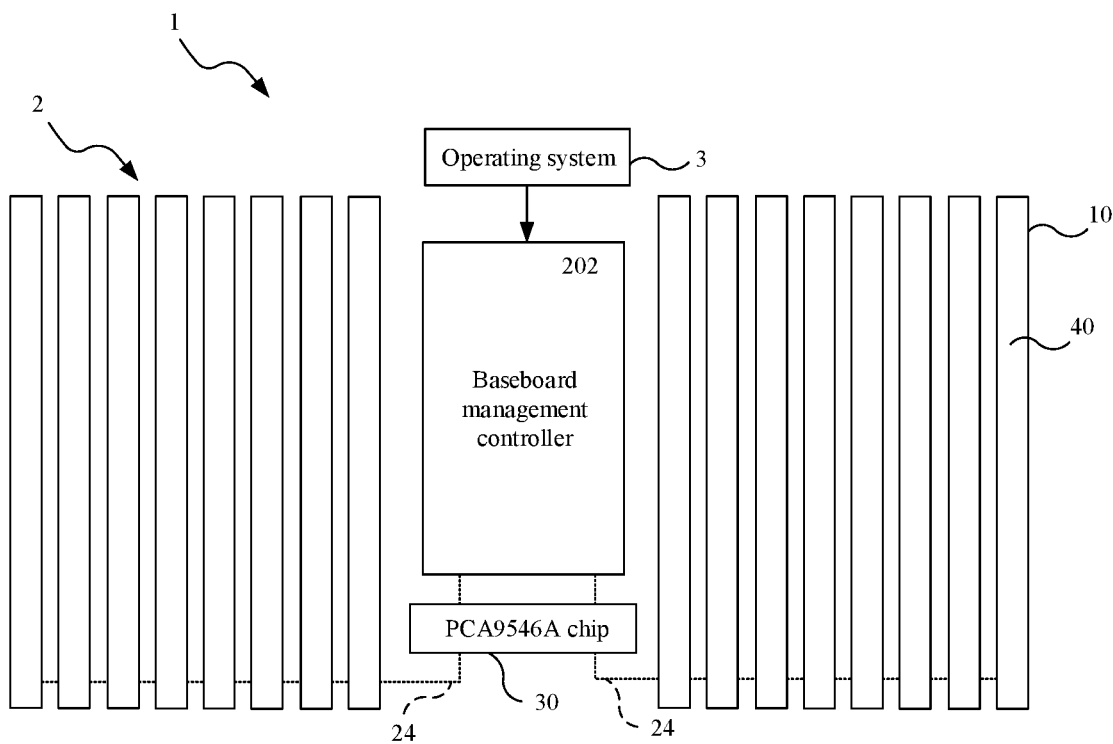
FIG. 4 shows a functional correlation diagram of a test system according to another embodiment of the present disclosure.

FIG. 4 is a functional correlation diagram of a test system 1 of a second embodiment of the present disclosure. In the second embodiment, the present disclosure also provides a test system 1 for a DRAM module 10 of an AMD system, which is configured to verify information write and read functions of an EEPROM 40 included in a DRAM module 10. As shown in FIG. 4, the test system 1 includes sixteen memory module slots 2 and a BMC 202.

The memory module slots 2 are configured for insertion of the DRAM modules 10. Therefore, sixteen DRAM modules 10 can be inserted into the sixteen memory module slots 2, respectively. Each DRAM includes an EEPROM 40. SPD information can be written into the EEPROMs 40, and therefore the EEPROMs 40 are those in which the information write and read functions are to be tested.

The BMC 202 can be electrically coupled to each memory module slot 2 through I²C buses 24. As shown in FIG. 2, there is an I²C bus 24 on the left and right, respectively. The BMC 202 is electrically coupled to the left and right sixteen memory module slots 2 through the two I²C buses 24, respectively.

The BMC 202 accesses the DRAM modules 10 inserted in the memory module slots 2 through the I²C buses 24 and can write and read test data in the EEPROMs 40 in the DRAM modules 40.

The test system 1 as described above further includes a PCA9546A chip 30. The PCA9546A chip 30 has a plurality of mapping addresses. The plurality of mapping addresses includes at least one mapping address corresponding to the DRAM module 10. After accessing the mapping address corresponding to the DRAM module 10 in the PCA9546A chip 30 and accessing all the DRAM modules 10 through the I²C buses 24, the BMC 202 then accesses the specific DRAM modules 10 out of all the DRAM modules 10, respectively, through the access addresses corresponding to the specific DRAM modules 10.

In the test system 1 described above, the test data may be sample data or SPD information. When there is no original sample data in the test system 1, in addition to writing the sample data into the EEPROM 40 and then reading it out, it is also possible to write the SPD information first instead. Similarly, the process is to access the EEPROM 40 of the DRAM module 10 through the I²C slave address, and then read the previously written SPD information from the EEPROM 40 of the DRAM module 10 through the I²C buses 24 to test the write and read functions.

In addition, due to the limited write and read times of the EEPROM 40, in the test system 1, the test data is verified by a small amount of writing and reading, which can reduce the time and energy required for each verification. In other words, the information read and write functions of the EEPROM are verified by writing the test data to a portion of the multiple bytes and then reading it out. For example, only 3 bytes of sample data are written into each quadrant of 128 bytes in the EEPROM as a test for writing and reading, which can effectively save test time and adapt to the hardware limitations of the EEPROM. The verification may also be performed by multiple averages within the same period to obtain the most accurate result, i.e., increasing the number of samples to obtain an average value of the test to confirm whether the information write and read functions of the EEPROM 40 are normal.

Figure 5:
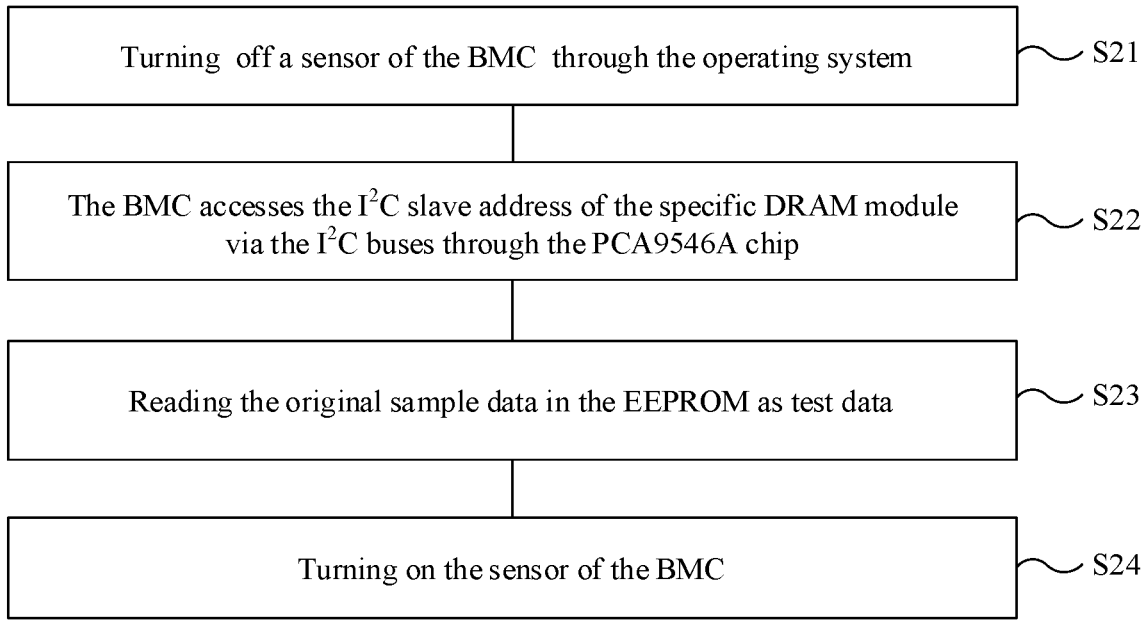
FIG. 5 is a flowchart of a method for detecting sample data through a BMC according to an embodiment of the present disclosure.
Figure 6:
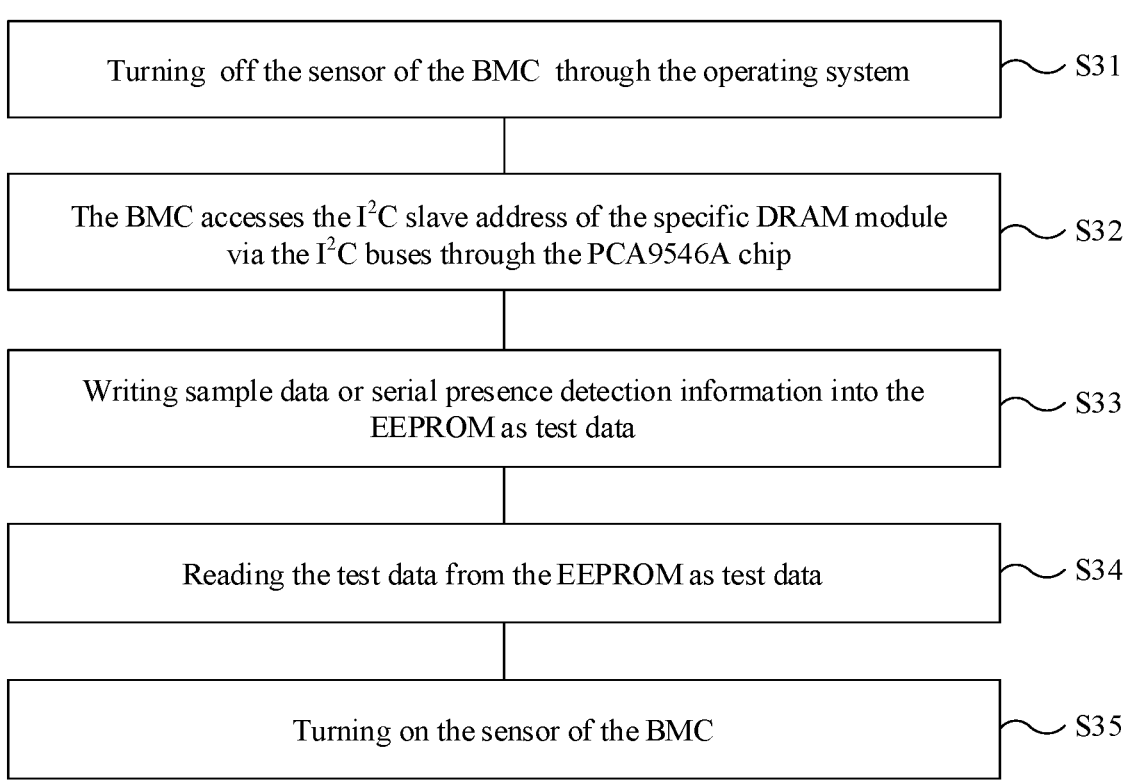
FIG. 6 is a schematic diagram of a method for detecting sample data through a BMC according to an embodiment of the present disclosure.

FIG. 5 shows a flowchart of a method of the present disclosure of detecting the sample data through the substrate management controller 202, and FIG. 6 shows a schematic diagram of a method of the present disclosure of detecting sample data through the substrate management controller 202. The method also includes two cases: one is the state where there is original sample data, and the other is the state where there is no sample data such that the sample data or the detection information is read and written.

A method for the state where original sample data is present includes the following steps.

At step S21, the test system 1 turns off the sensor of the BMC 202 through an operating system 3, so as to reduce the impact of the BMC 202 on the EEPROM 40.

At step S22, the PCA9546A chip 30 is switched to channels 0, 1, 2, and 3 in turn, and the BMC 202 is communicatively connected to the memory module slots 2 through the PCA9546A chip 30 via the I²C buses 24, and accesses the I²C slave address corresponding to a specific DRAM module 10 according to the mapping addresses corresponding to the DRAM modules 10 in the PCA9546A chip 30, so as to access the specific DRAM module 10.

At step S23, the original sample data in the EEPROM 40 is read from the EEPROM 40 of the DRAM module 10 as test data.

At step S24, the sensor of the BMC 202 is turned on after the test.

A method of reading and writing sample data or SPD information as test data includes the following steps.

At step S31, the test system 1 turns off a sensor of the BMC 202 through the operating system 3, so as to reduce the impact of the BMC 202 on the EEPROM 40.

At step S32, the PCA9546A chip 30 is switch to channels 0, 1, 2, and 3 in turn, and the BMC 202 is communicatively connected to the memory module slots 2 through the PCA9546A chip 30 via the I²C buses 24, and accesses the I²C slave address corresponding to a specific DRAM module 10 according to the mapping addresses corresponding to the DRAM modules 10 in the PCA9546A chip 30, so as to access the specific DRAM module 10.

At step S33, sample data or SPD information is written into the EEPROM 40 of the DRAM module 10 as test data.

At step S34, the test data is read form the EEPROM 40.

At step S35, the sensor of the BMC 202 is turned on after the test.

Therefore, the test system 1 for the DRAM module 10 of the AMD system provided by the present disclosure can access the DRAM module via the I²C buses 24 through the processing unit 20 of the AMD central processing unit or the BMC 202, and further write the test data to and read the test data from the EEPROM. When the test data does not have sample data, the verification can be performed by writing the sample data or SPD information first and then read it out.

The above detailed description of the preferred embodiments is intended to describe the features and spirit of the present disclosure more clearly rather than limit the scope of the present disclosure with the preferred embodiments disclosed above. On the contrary, the intention is to cover various changes and equivalent arrangements within the scope of the claimed patent scope of the present disclosure.

What is claimed is:

1. A test system for a DRAM of an AMD system, configured to verify information write and read functions of an EEPROM comprised in at least one DRAM, the test system comprising:
at least one memory module slot configured for insertion of the at least one DRAM; and
a BMC, the BMC being electrically coupled to the at least one memory module slot through at least one I²C bus;
wherein the BMC accesses the at least one DRAM through the at least one I²C bus, and writes test data to and reads the test data from the EEPROM;
wherein the test system turns off a sensor of the BMC through an operating system before the BMC accesses the at least one DRAM through the at least one I²C bus and writes the test data to the EEPROM, and the test system turns on the sensor of the BMC after verifying the information write and read functions of the EEPROM.

2. The test system according to claim 1, wherein the test system further comprises a PCA9546A chip, the PCA9546A chip comprising a plurality of mapping addresses, and the plurality of mapping addresses comprising at least one mapping address corresponding to the at least one DRAM, wherein when accessing the mapping address corresponding to the at least one DRAM in the PCA9546A chip, the BMC accesses the at least one DRAM through the I²C bus and then access a specific DRAM out of the at least one DRAM through the access address corresponding to the specific DRAM.

3. The test system according to claim 1, wherein the test data is one of sample data and serial presence detection information.

4. The test system according to claim 1, wherein the EEPROM comprises four quadrants, each of the four quadrants comprising multiple bytes, the information read and write functions of the EEPROM is verified by writing the test data to a portion of the multiple bytes and reading it out.

* * * * *